United States Patent [19]

Szabela et al.

[11] Patent Number: 4,902,964

[45] Date of Patent: Feb. 20, 1990

[54] PROGRAM CLOCK FOR AN ELECTRONIC DEMAND REGISTER WITH AUTOMATIC CALIBRATION BASED ON SENSED LINE FREQUENCY

[75] Inventors: William A. Szabela, Brookston; Gordon R. Burns, Lafayette, both of Ind.

[73] Assignee: Landis & GYR Metering, Inc., Lafayette, Ind.

[21] Appl. No.: 99,078

[22] Filed: Sep. 21, 1987

[51] Int. Cl.[4] .................... G01R 11/32; G01R 11/04
[52] U.S. Cl. .................... 324/103 P; 324/74; 324/142; 364/483; 364/571.01
[58] Field of Search ............... 364/571, 484, 492, 483; 324/103 P, 103 R, 78 Z, 74, 130, 102, 142, 137, 96, 113, 116; 368/223, 239, 242

[56] References Cited

U.S. PATENT DOCUMENTS

| | | | |
|---|---|---|---|
| 3,399,347 | 8/1968 | Martens | 324/96 |
| 3,796,953 | 3/1974 | Zisa et al. | 324/137 |
| 3,990,007 | 11/1976 | Hohhof . | |
| 3,993,984 | 11/1976 | Penrod | 324/78 Z |
| 4,031,464 | 6/1977 | Norberg | 324/78 Z |
| 4,034,292 | 7/1977 | McClelland, III | 324/137 |
| 4,253,151 | 2/1981 | Bouve . | |
| 4,270,846 | 6/1981 | Miyamoto | 368/242 |
| 4,291,376 | 9/1981 | McCahill | 324/113 |
| 4,319,329 | 3/1982 | Girgis et al. | 364/484 |
| 4,345,311 | 8/1982 | Fielden . | |
| 4,355,361 | 10/1982 | Riggs et al. . | |
| 4,465,970 | 8/1984 | DiMassimo et al. . | |
| 4,542,469 | 9/1985 | Brandyberry et al. . | |
| 4,627,737 | 12/1986 | Nance et al. | 368/239 |
| 4,672,555 | 6/1987 | Hart et al. | 364/483 |
| 4,752,919 | 6/1988 | Clark | 368/223 |

FOREIGN PATENT DOCUMENTS 0136868 10/1979 Japan .................. 368/239

OTHER PUBLICATIONS

Instruction Manual for an Electronic Demand Recording Register, entitled "Instructions Type TMR-92 TOU Electronic Demand Recording Register", General Electric Publication No. GEH-5053, pp. 6, 7, 12, 13 and 43.

"Instructions-Type TMR-92 TOU Electronic Demand Recording Register", by General Electric, vol. GEH-5053, pp. 1-81, date unknown.

Primary Examiner—Ernest F. Karlsen
Assistant Examiner—W. Burns
Attorney, Agent, or Firm—Woodard, Emhardt, Naughton, Moriarty & McNett

[57] ABSTRACT

An electronic demand register includes a microprocessor including a program clock for performing timekeeping functions for the register. A power supply connected across the AC voltage source provides power to the microprocessor through a voltage regulator. The program clock is maintained by the line frequency of the AC source. Electronic circuits are provided for calibrating the program clock to be compatible with either a 50 Hz or a 60 Hz line frequency. A detection signal corresponding to the line frequency is generated by a line frequency detector circuit in the power supply. A reference signal is generated by a quartz crystal clock. A frequency comparator circuit includes a microprocessor program that measures the time period between detection signal pulses. This time period is compared to the known period of a 50 Hz or a 60 Hz signal and respective counters are incremented accordingly. The microprocessor and program clock operating parameters are established for either 50 Hz of 60 Hz operation when one of the counters has reached a value of five, indicating that five zero crossings have been detected at the particular frequency. The electronic demand register also comprises a display including an array of LCD segments for continuous simultaneous display of the time and date. The display also includes an array of LCD segments, arranged in a pattern, that are sequentially illuminated corresponding to the rate of rotation of the shutter disk of the pulse initiator.

9 Claims, 3 Drawing Sheets

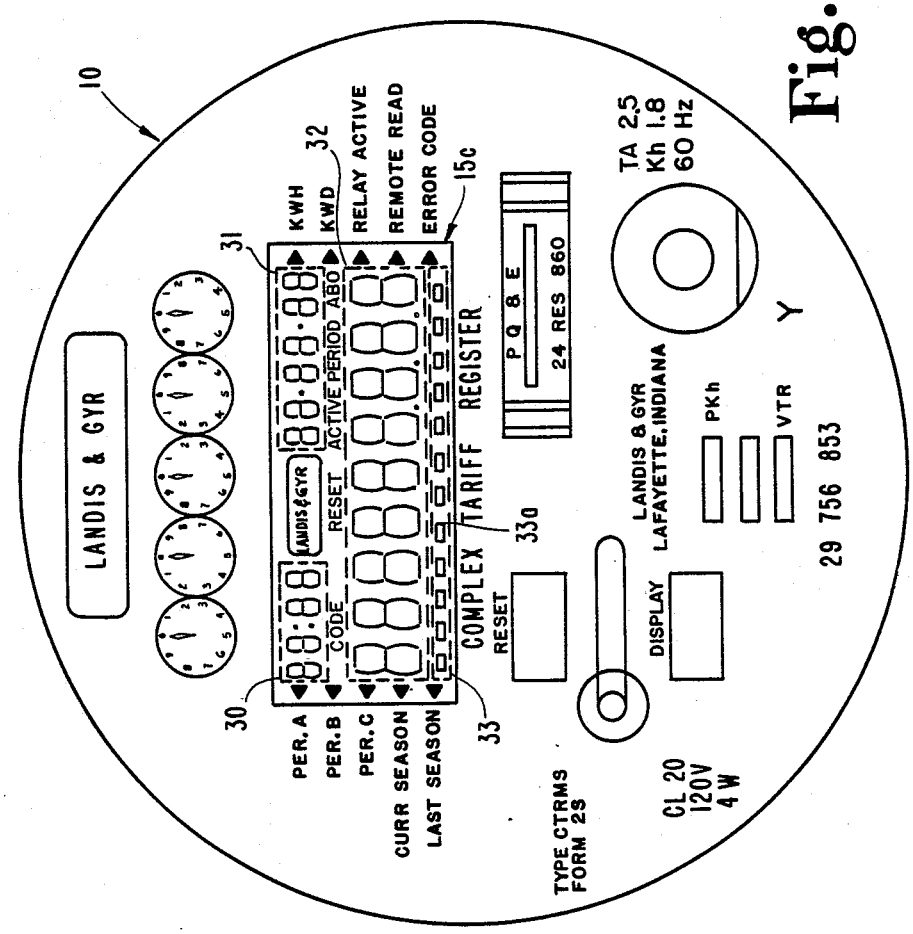

PROGRAM CLOCK FOR AN ELECTRONIC DEMAND REGISTER WITH AUTOMATIC CALIBRATION BASED ON SENSED LINE FREQUENCY

BACKGROUND OF THE INVENTION

This invention relates to electronic watthour meters and demand registers utilizing microprocessors having a program clock performing timekeeping functions for the register. In particular, the invention relates to calibration of the program clock based on the line frequency of the AC supply.

Since the advent of solid state electronics into the field of AC power consumption measurement, increasingly sophisticated watthour meters and demand registers have utilized programmable microprocessors. These microprocessors accumulate and store usage data, perform involved calculations over programmed time periods and control comprehensive digital displays. Since real time plays an essential role in the function of these electronic watthour meters and demand registers, some means for timekeeping, such as a program clock, is incorporated into the microprocessor.

Most program clocks are maintained by the line frequency of the AC source supplying the load being monitored. The AC line frequency is carefully controlled by the power companies, consequently a clock maintained by this line frequency is sufficiently accurate for the purposes of a demand register. Most power companies provide AC electricity at a line frequency of either 50 Hz or 60 Hz. In the past, separate meters or registers have been provided having a program clock programmable for either a 50 Hz or a 60 Hz signal.

In light of this background, it is an object of the present invention to provide a means for sensing the line frequency and automatically programming the microprocessor program clock accordingly. Another object is to provide a single demand register to accommodate a number of line frequencies without outside intervention.

SUMMARY OF THE INVENTION

An electronic demand register for measuring AC power consumption from an AC source includes a microprocessor having a program clock, or an internal timing signal, proportional to the line frequency of the AC source, and means for automatically calibrating the generation of the timing signal based on the line frequency of the AC source. The calibrating means includes a detection circuit for generating a first signal corresponding to the line frequency of the AC source and a quartz crystal for generating a reference timing signal. The calibrating means further includes a timer/counter, based on the reference timing signal, for determining the period of the first signal and for comparing this period to the known period of a 50 Hz or a 60 Hz signal to determine the line frequency.

The electronic demand register may include means in the microprocessor for determining date and time and a digital display for continuously simultaneously displaying the time and the date. The electronic demand register may also include a pulse initiator having a rotatable disk, and the digital display may include a plurality of LCD segments, arranged in a pattern, that are sequentially illuminated corresponding to the rate of rotation of said disk.

BRIEF DESCRIPTION OF THE DRAWINGS

FIG. 3 is a representation of the face of the electronic demand register showing the LCD display of one embodiment of the present invention.

DESCRIPTION OF THE PREFERRED EMBODIMENT

Figure 1:
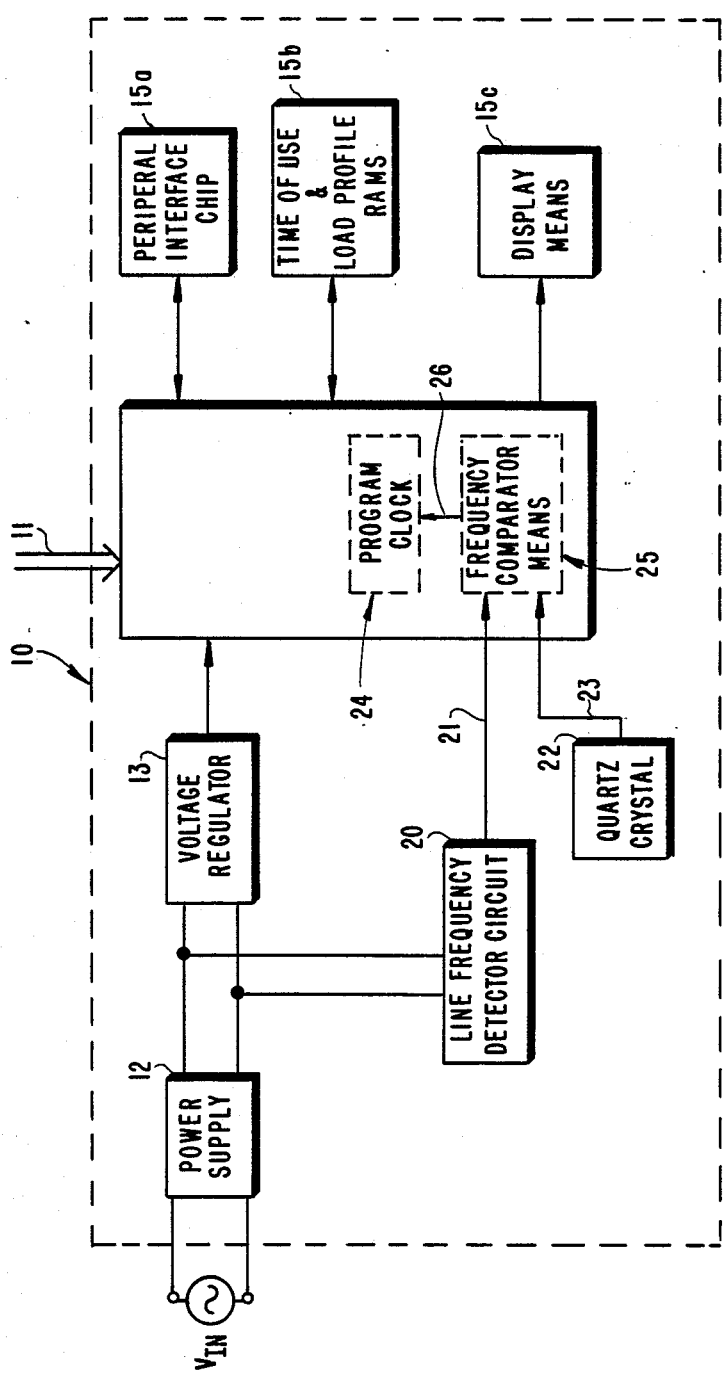
FIG. 1 is a block diagram illustrating the electronic demand register of one embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

In the preferred embodiment, a demand register 10 receives signals 11 from a watthour meter corresponding to the AC power consumption by the monitored load, as idealized in the block diagram of FIG. 1. The register 10 may be physically remote from the meter or form an integral part of the meter. The register 10 includes a power supply 12 connected across the AC voltage source. A voltage regulator 13 converts the AC signal from the power supply 12 to a DC voltage at a level compatible with the solid state circuitry of the register, typically about 10 volts. The DC voltage from regulator 13 is provided to a microprocessor 14 that may, for example, accumulate and store power consumption data and perform time-of-use or load profile calculations. Outputs from microprocessor 14 may feed auxiliary I.C.s, such as peripheral interface chip 15a, separate RAMs 15b or an LCD display means 15c.

A line frequency detection circuit 20 is included in a power supply 12. The detection circuit 20 generates a test signal 21, input to microprocessor 14, representative of the line frequency of the AC voltage source. In the preferred embodiment, the line frequency detection circuit includes a Schmitt Trigger that generates a periodic waveform at a frequency double the line frequency. Thus, for a 60 Hz line frequency, the detection signal 21 is a 120 Hz square wave. A quartz crystal 22 provides a reference signal 23 to microprocessor 14. In the preferred embodiment, quartz crystal 22 is a crystal oscillator having a frequency of 11.0592 MHz.

Figure 2:
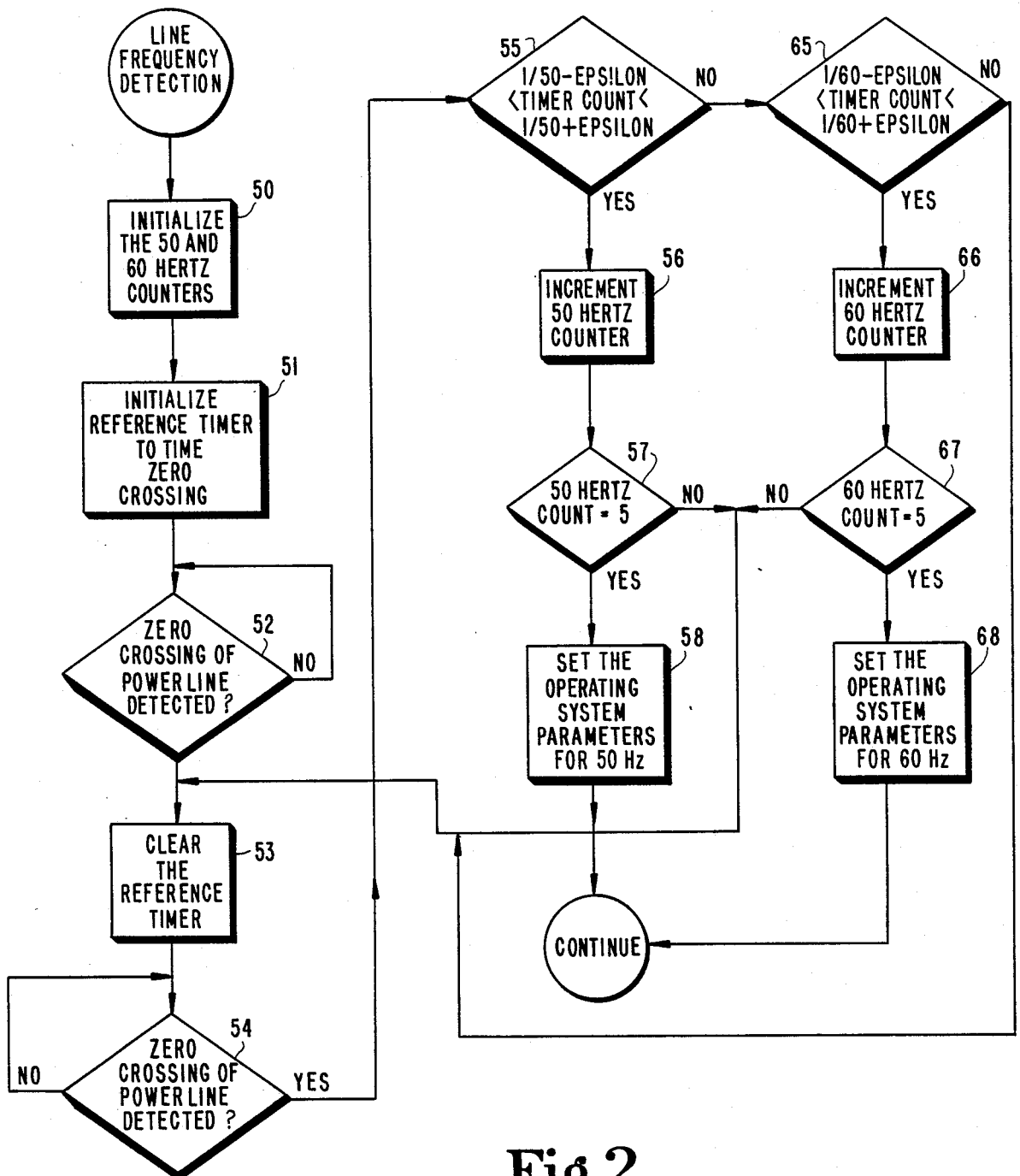
FIG. 2 is an operational flowchart for the frequency comparator of the demand register of the present invention.

The microprocessor 14 includes a program clock 24, maintained by the line frequency of the AC source, that provides the internal timekeeping signal for the operation of the microprocessor. The microprocessor 14 also includes frequency comparator means 25 that receives the detection signal 21 from the line frequency detector circuit 20 and the reference signal 23 from the quartz crystal 22. In the preferred embodiment, the frequency comparator means 25 comprises a program resident on microprocessor 14. The operation of this program is described with reference to the flowchart in FIG. 2.

Storage locations in the internal RAM of microprocessor 14 are initialized at steps 50 and 51 for a 50 Hz, 60 Hz and Reference Timer counter. The Reference Timer counter is driven by the quartz crystal reference signal 23. The program commences when a zero crossing of the AC input is encountered at step 52, that is when detection signal 21 pulses. When the counting portion of the program commences, the Reference Timer is cleared (step 53) and then begins timing at conditional loop 54 until another zero crossing is encountered from detection signal 23. When the condition at step 54 is satisfied, the Reference Timer counter contains a value corresponding to the amount of time elapsed between zero crossings, or between pulses of the detection signal 21.

In steps 55 and 65, the value in the Reference Timer counter is compred against a value corresponding to the period of a 50 Hz signal (1/50) or a 60 Hz signal (1/60) within an error constant (epsilon). If neither test of steps 55 or 65 is met, program control returns to step 53 and the Reference Timer is restarted. If either of the conditionals in step 55 or step 65 is satisfied, the respective 50 Hz or 60 Hz counter is incremented in step 56 or 66, respectively. This sequence of steps is repeated until five zero crossings at one of the frequencies has been encountered, according to conditionals 57 and 67. Finally, when either of the conditionals 57 or 67 is satisfied, the operating system parameters for the microprocessor 14 and program clock 24 are established, for 50 Hz in step 58 or for 60 Hz in step 68.

The present invention provides an automatic means to program the microprocessor program clock based on the line frequency of the AC sources. Since the frequency detection and program clock calibration occurs automatically when power is supplied to the register, no outside intervention is required to establish the program clock. An additional benefit is that one meter can be adapted to accommodate a number of line frequencies. Additional logic in the frequency comparator means of the microprocessor can be added to make a similar line frequency determination for other frequency values.

One of the timekeeping functions of the program clock 24 is to maintain real time. Thus, demand register 10, or more particularly microprocessor 14, can maintain accurate date and time-of-day information. In another aspect of the present invention, display means 15c, mounted on the face of the demand register 10, includes LCD segment arrays 30, 31 and 32. LCD segment array 30 provides a continuous display of the time-of-day in hours and minutes, while LCD array 31 provides a continuous display of the date by month, day and year. LCD array 32 provides a sequential display of load consumption informaiton (such of time-of-use and load profile date), separate from the date and time displays on LCD arrays 30 and 31. Microprocessor 14 is programmed to effectuate such a display. In prior art electronic demand registers, a single LCD segment array is provided by which all data, including date, time and usage information, is sequentially displayed. To applicant's knowledge, no prior art device provides a continuous simultaneous display of the date and the time-of-day, with a separate sequential display of usage data. Such a display is beneficial to the consumer or meter-reader, because it allows the user to sequentially display usage information on LCD segment array 32 while having a continuous indication of the date and time for convenient reference.

Another feature of the demand register 10 of the present invention is the "caterpillar crawl" LCD segment array 33 at the lower portion of the display means 15c shown in FIG. 3. The LCD array 33 includes twelve LCD segments, such as LCD 33a, controlled by microprocessor 14 to correspond to the rotation of the rotating shutter disk of an optical pulse initiator included in electronic demand register 10. LCD segments in LCD array 33 are sequentially illuminated in groups of three segments to correspond to the rotation of the shutter disk. In the preferred embodiment, the sequential display is bi-directional to accommodate forward and reverse rotations of the shutter disk.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An electronic demand register for registering AC power consumption from an AC source, comprising:
   a microprocessor including timing means for generating periodic timing signals in relation to the cycles of the AC source;
   means for automatically calibrating the generation of said periodic timing signals based on the line frequency of the AC source; and
   means for registering power consumption over a time period determined by said periodic timing signals.

2. The electronic demand register of claim 1, which also includes:
   means for generating a periodic first signal corresponding to the line frequency of the AC source; and
   means for measuring the period of said first signal and for comparing said period to the known period of a 50 Hz or 60 Hz signal to determine the line frequency of the AC source.

3. The electronic demand register of claim 2, wherein said first signal generating means includes a Schmitt Trigger circuit.

4. The electronic demand register of claim 2, wherein said measuring means includes:
   timer means for generating a reference timing signal, said timer means including a quartz crystal.

5. The electronic demand register of claim 2, further comprising:
   means in said microprocessor for determining date and time; and
   digital display means for continuously simultaneously displaying the time and the date, including a separate display for each of the time and the date.

6. The electronic demand register of claim 5, wherein:
   said register further includes a pulse initiator hving a rotatable disk; and
   said digital display means further includes:
   an array of LCD segments arranged in a pattern; and
   means for sequentially illuminating said array of LCD segments corresponding to the rate of rotation of said disk.

7. An electronic demand register for registering AC power consumption from the AC source, comprising:
   a microprocessor including a program clock maintained by the line frequency of the AC source;
   means for automatically selectably adapting said program clock for generating periodic timing signals in relation to either a 50 Hz or a 60 Hz frequency when said electronic demand register is energized, including means for detecting the line frequency of the AC source, whereby the selectable adaptation is based on the detected line frequency.

8. The electronic demand register of claim 1 further comprising:
   a pulse initiator having a rotatable disk;
   digital display means including;
      an array of LCD segments arranged in a pattern; and
      means for sequentially illuminating said array of LCD segments corresponding to the rate of rotation of said disks.

9. The electronic demand register of claim 8, wherein said means for sequentially illuminating includes means for bi-directionally sequentially illuminating said array of display LCD segments corresponding to the direction of rotation of said disk.

* * * * *